(12) United States Patent
Subramani et al.

(10) Patent No.: US 9,147,603 B2
(45) Date of Patent: Sep. 29, 2015

(54) POLYMER GRAFTING FOR ENHANCED DIELECTRIC AND INTERCONNECT MATERIAL ADHESION

(71) Applicant: INTEL CORPORATION, Santa Clara, CA (US)

(72) Inventors: Chandramouleeswaran Subramani, Chandler, AZ (US); Ravindra V. Tanikella, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/161,998

(22) Filed: Jan. 23, 2014

(65) Prior Publication Data

US 2015/0206793 A1    Jul. 23, 2015

(51) Int. Cl.
*H01L 21/4763* (2006.01)
*H01L 21/768* (2006.01)
*H01L 23/50* (2006.01)
*H01L 23/482* (2006.01)

(52) U.S. Cl.
CPC .... *H01L 21/76834* (2013.01); *H01L 21/76837* (2013.01); *H01L 23/4827* (2013.01); *H01L 23/50* (2013.01)

(58) Field of Classification Search
None
See application file for complete search history.

(56) References Cited

U.S. PATENT DOCUMENTS 5,206,308 A * 4/1993 Auerbach et al. ............. 525/410

OTHER PUBLICATIONS

Bong, et al., "Non-Polydimethylsiloxane Devices for Oxygen-Free Flow Lithography", Nature Communications, May 1, 2012, 10 pages.
Fan, Haibo, "Molecular Simulation of Cu-SAM Adhesion Force", Proceedings of the 5th International Conference on Thermal and Mechanical Simulation and Experiments in Microelectronics and Microsystems, May 10-12, 2004, pp. 575-579.
Im, et al., Patterning Nanodomains with Orthogonal Functionalities: Solventless Synthesis of Self-Sorting Surfaces, vol. 130, No. 44, Aug. 8, 2008, pp. 14424-14425.
Hara, et al., "Measurement of Adhesion Strength in Copper Interconnection Layers", Electrochemical and Solid Letters, vol. 7, Issue No. 2, Dec. 15, 2003, pp. G28-G30.
Tenhaeff, et al., "Initiated Chemical Vapor Deposition of Alternating Copolymers of Styrene and Maleic Anhydride", Langmuir, vol. 23, No. 12, Mar. 7, 2007, pp. 6624-6630.

(Continued)

*Primary Examiner* — Kyoung Lee
(74) *Attorney, Agent, or Firm* — Winkle, PLLC

(57) ABSTRACT

A microelectronic structure may include an interconnect structure, an amine functional reactive polymer layer grafted onto the interconnect structure, and a dielectric layer on the amine functional reactive polymer layer, wherein the dielectric layer is bonded to the polymer layer with an amine bond. In one embodiment, the interconnect structure may be fabricated from a copper containing material. In a further embodiment, the dielectric layer may comprise an oxygen functional reactive dielectric layer, such as an epoxy dielectric layer. In one method of fabricating the microelectronic structure, the amine functional reactive polymer layer may be grafted onto the interconnect structure by an initiated chemical vapor deposition process.

20 Claims, 4 Drawing Sheets

(56) References Cited

OTHER PUBLICATIONS

Wiedenman, et al., "Multi-layer Copper-Dielectric Adhesion Challenges of 5-12 micron Lines/Spaces for Next Generation SOP (System-on-Package) / Microprocessor Package Substrates", IEEE Electronic Components and Technology Conference, Proceedings 57th, Jun. 1, 2007, pp. 1431-1435.

Xu, et al., Conformal, Amine-Functionalized Thin Films by Initiated Chemical Vapor Deposition (iCVD) for Hydrolytically Stable Microfluidic Devices, vol. 22, Issue No. 5, Jan. 22, 2010, pp. 1732-1738.

* cited by examiner

POLYMER GRAFTING FOR ENHANCED DIELECTRIC AND INTERCONNECT MATERIAL ADHESION

TECHNICAL FIELD

Embodiments of the present description generally relate to the field of microelectronic device fabrication, and, more particularly, to forming a microelectronic structure comprising a dielectric layer adhered to a copper material with a polymer layer

BACKGROUND

The microelectronic industry is continually striving to produce ever faster and smaller microelectronic devices for use in various mobile electronic products, such as portable computers, electronic tablets, cellular phones, digital cameras, and the like. As these goals are achieved, the fabrication of the microelectronic devices becomes more challenging. One such challenging area relates to the interconnect layers that are used to connect the individual devices on a microelectronic chip and/or to send and/or receive signals external to the individual device(s). Interconnect layers generally comprise a dielectric material having conductive interconnects (lines) coupled to the individual devices. The interconnects (lines) generally comprise a metal line portion and a metal via portion, wherein the metal line portion is formed in a trench within the dielectric material and the metal via portion is formed within a via opening that extends from the trench through the dielectric material. It is understood that a plurality of interconnection layers (e.g., five or six levels) may be formed to effectuate the desired electrical connections. For example, a first interconnection layer having first interconnects formed in a first dielectric material may have a second dielectric material deposited on the first dielectric material and the first interconnects as a part of a second interconnection layer, wherein second interconnects may be formed in the second dielectric material, etc.

As these interconnects are manufactured at smaller pitches (e.g. narrower and/or closer together), the surface area of the interconnects in a first interconnection layer contacting the dielectric layer in a second interconnection layer formed thereon increases. However, materials which are used to form interconnects, such as copper and copper containing materials, generally have poor adhesion to dielectric materials. In order to increase the adhesion between interconnects and dielectric materials, the interconnects may be roughen, such as by chemical etching, to provide physical anchoring for the dielectric material. However, poor control over the roughening process may limit the achievement of fine interconnect spacing which is crucial for high density interconnects.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
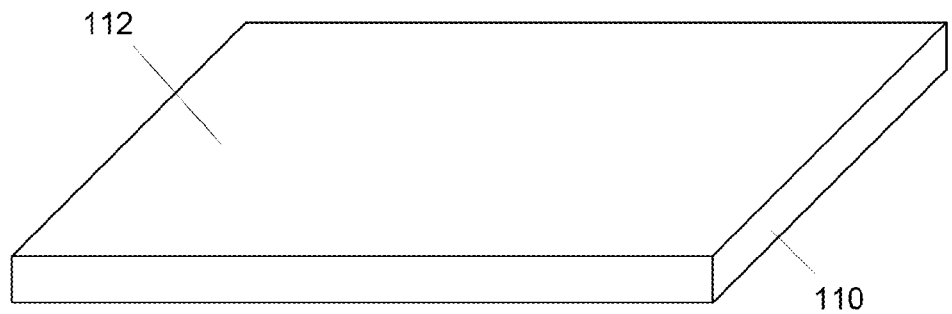
FIGS. 1-6 illustrate cross-sectional views of a method of forming a microelectronic structure comprising a dielectric layer adhered to an interconnect structure with a polymer layer, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic structure having an interconnect structure, an amine functional reactive polymer layer grafted onto the interconnect structure, and a dielectric layer on the amine functional reactive polymer layer, wherein the dielectric layer is bonded to the polymer layer with an amine bond. In one embodiment, the interconnect structure may be fabricated from a copper containing material. In a further embodiment, the dielectric layer may comprise an oxygen functional reactive dielectric layer, such as an epoxy dielectric layer. In one method of fabricating the microelectronic structure, the amine functional reactive polymer layer may be grafted onto the interconnect structure by an initiated chemical vapor deposition process.

FIG. 1 illustrates an interconnect structure 110 having a first surface 112. The interconnect structure 110 may be fabricated from any appropriate conductive material, such as metals, including but not limited to copper and copper-containing material, which may be formed by core or electrolytic copper deposition processes, as will be understood to those skilled in the art. It is also understood that the illustrated interconnect structure 110 is merely representational, as it may be any material or structure that may be susceptible to delamination with a dielectric material that may be subsequently deposited thereon.

Figure 2:
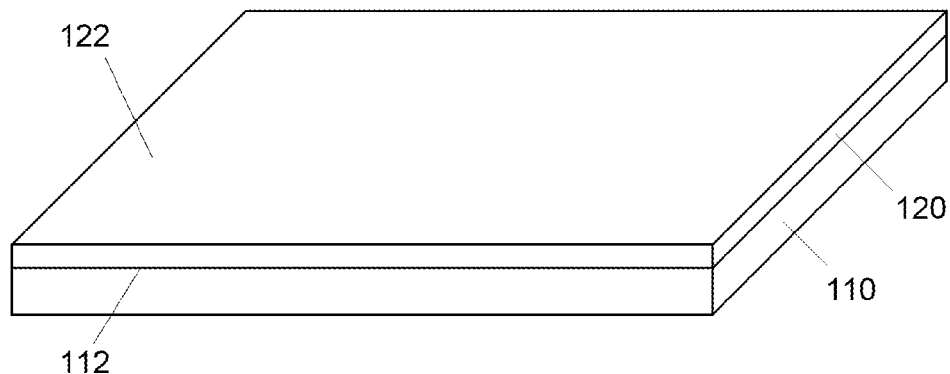
Figure 3:
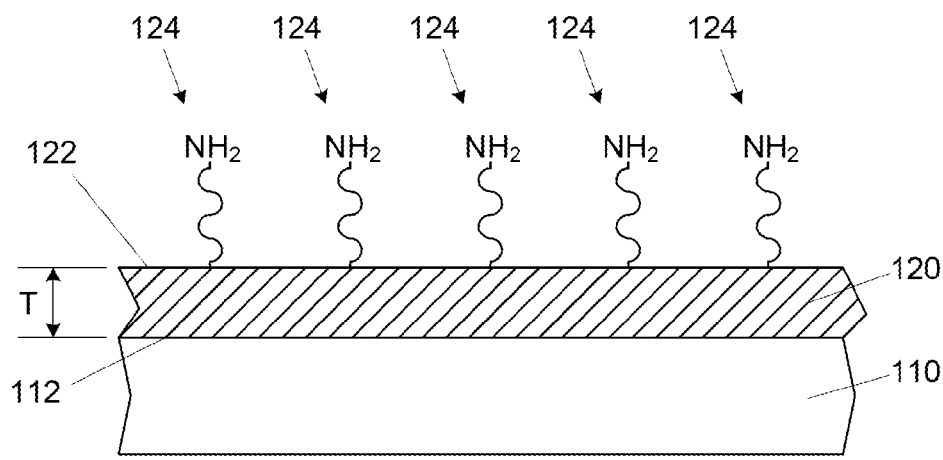

FIGS. 2 and 3 illustrate an amine functional reactive polymer layer 120 grafted on the interconnect structure first surface 112. As will be understood to those skilled in the art, grafting, in the context of polymer chemistry, refers to the addition or attachment of polymer chains onto a surface. In one embodiment, the amine functional reactive polymer layer 120 may be grafted onto the interconnect structure first surface 112 by initiated chemical vapor deposition process. Such a process may include cleaning the interconnect structure first surface 112 by any technique known in the art and placing the interconnect structure 110 in a chemical vapor deposition chamber, wherein the chemical vapor deposition chamber may be brought under vacuum. At least one monomer (e.g. a molecule that may bind chemically to other monomer molecules to form a polymer) and at least one initiator may be introduced into the chemical vapor deposition chamber. When the initiator contacts heated filaments within the chemical vapor deposition chamber, it may be broken into radicals which reacts with or polymerizes the monomers on the interconnect structure 110. FIG. 3 illustrates the amine functional groups 124 with a single amine group ($NH_2$), but may include multiple amine groups. Furthermore, with regard to the initiated chemical vapor deposition process, the specific techniques, equipment, and operating parameters thereof are well known in the art and, for the sake of clarity and conciseness, will not be discussed with specificity herein.

In one embodiment, the monomers may include, but is not limited to, amines, phenols, thiols, isocyanates, organic acids, anhydrides, and combinations thereof in order for amine functional groups 124 to be available on a first surface 122 of the amine functional reactive polymer layer 120. In one embodiment, monomers may include an amine selected from the group consisting of allylamine, 4-aminophenyl propargyl ether, amino methyl styrene, N-(3-aminopropyl)methacrylamide hydrochloride, ethyleneimine, propyleneimine, 2-aminoethyl methacrylate hydrochloride, diallylamine, methacryloyl-L-Lysine, N-(2-aminoethyl) methacrylamide hydrochloride, N-(3-aminopropyl)methacrylamide hydrochloride, and protected amine monomers, such as 2-N-morpholinoethyl acrylate.

In an embodiment, the initiator may include, but are not limited to, tert-butyl hydroperoxide, tert-butyl peracetate, cumene hydroperoxide, 2,5-di(tert-butylperoxy)-2,5-dimethyl-3-hexyne, dicumyl peroxide, 2,5-bis(tert-butylperoxy)-2,5-dimethylhexane, benzoyl peroxide 2-butanone peroxide, tert-butyl peroxide, lauroyl peroxide, tert-butyl peroxybenzoate, ammonium persulfate, hydroxymethanesulfinic acid monosodium salt dehydrate, potassium persulfate, sodium persulfate, 4,4'-azobis(4-cyanovaleric acid), 1,1'-azobis(cyclohexanecarbonitrile), Azobisisobutyronitrile, 2,2'-Azobis(2-methylpropionamidine) dihydrochloride, and 2,2'-Azobis(2-methylpropionitrile).

As will be understood to those skilled in the art, with the proper selection of monomers and initiators, the amine functional reactive polymer layer 120 may comprise, but is not limited to, poly allylamine, poly 4-aminophenyl propargyl ether, poly amino methyl styrene, poly N-(3-aminopropyl) methacrylamide hydrochloride, polyethyleneimine, polypropyleneimine, poly 2-aminoethyl methacrylate hydrochloride, poly diallylamine, poly methacryloyl-L-lysine, poly N-(2-aminoethyl) methacrylamide hydrochloride, poly N-(3-aminopropyl)methacrylamide hydrochloride, and protected amine monomers, such as 2-N-morpholinoethyl acrylate. In one embodiment, the amine functional reactive polymer layer 120 may be less than about 200 nm thick T.

Figure 4:
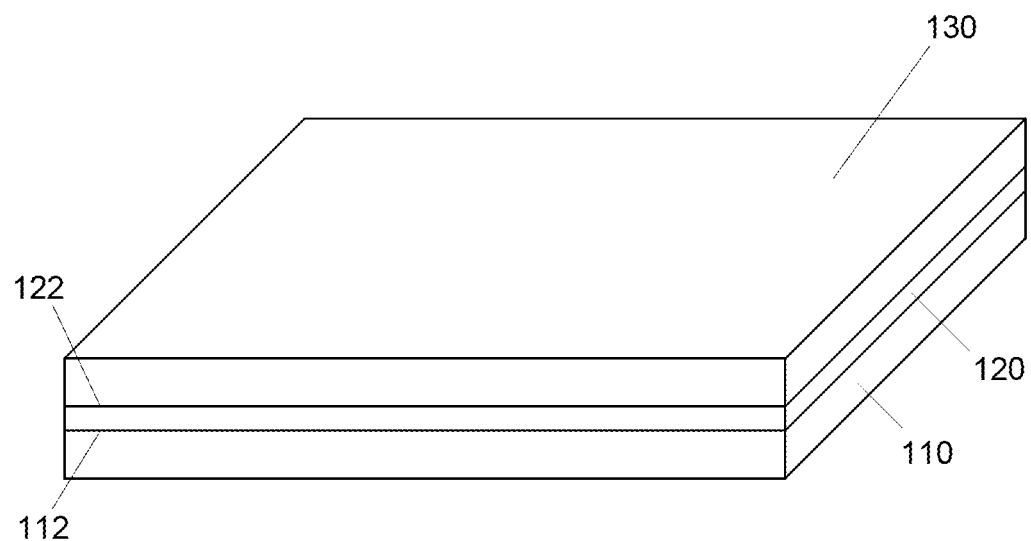
Figure 5:
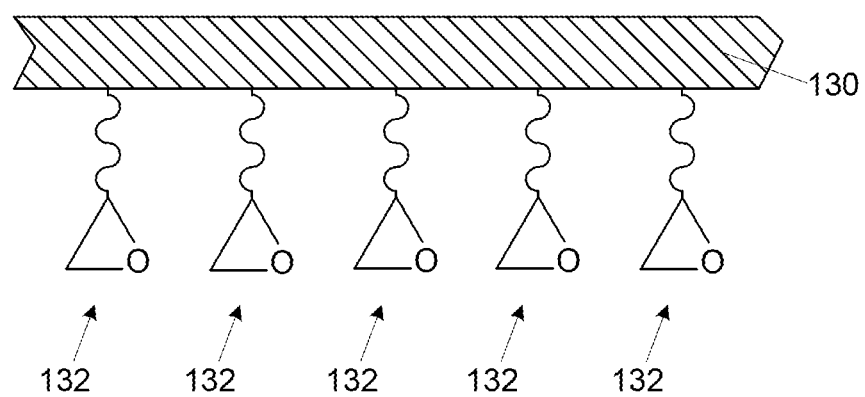
Figure 6:
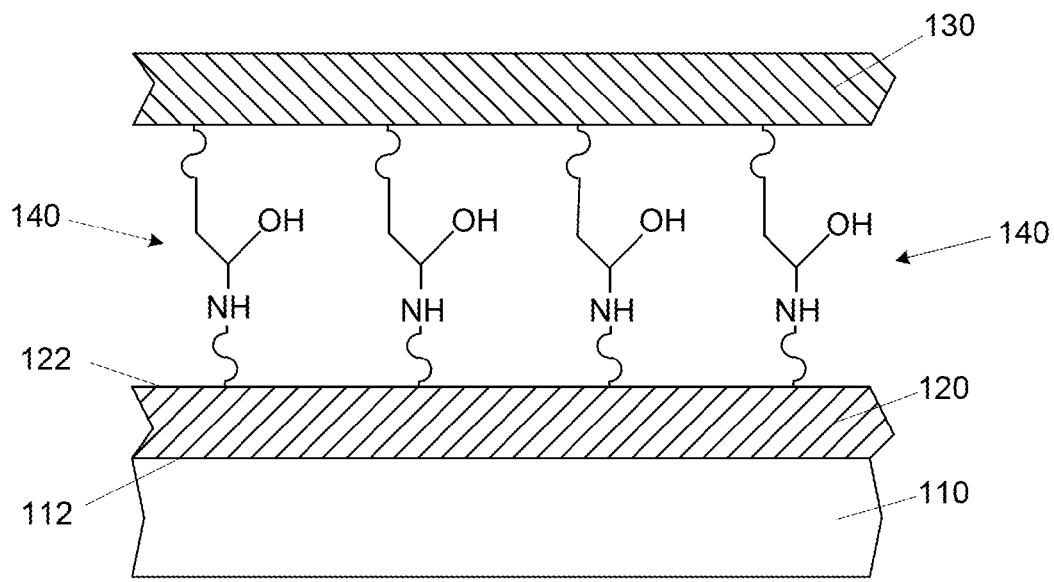

As illustrated in FIG. 4, a dielectric layer 130, such as an oxygen functional reactive dielectric layer, may be formed on the amine functional reactive polymer layer 120. The dielectric layer 130 may be any appropriate material, including but not limited to, epoxies, isocyanate resins, phenolic resins, thiolate resins, anhydride polymers, and filled compositions of the same. In one embodiment, the dielectric layer 130 may comprise a silica-filled epoxy, such as materials available from Ajinomoto Fine-Techno Co., Inc., 1-2 Suzuki-cho, Kawasaki-ku, Kawasaki-shi, 210-0801, Japan (e.g. Ajinomoto ABF-GX13, Ajinomoto GX92, and the like). As illustrated in FIG. 5, the dielectric layer 130 may be an epoxy having at least one epoxide group 132 (e.g. oxygen functional reactive group). As shown in FIG. 6, the amine functional groups 124 of the amine functional reactive polymer layer 120 may react with the epoxide group 132 of the oxygen functional reactive dielectric layer 130 to form a hydroxyl group (i.e. —OH) and a secondary amine (i.e. —NH—), wherein the secondary amine forms an amine bond 140 between the amine functional reactive polymer layer 120 and the dielectric layer 130. This reaction may occur during a lamination process for depositing the dielectric layer 130 and/or during post-curing of the dielectric layer 130, as will be understood to those skilled in the art. Furthermore, it is understood that the materials and reaction illustrated in FIGS. 5 and 6 are merely exemplary and may be any appropriate materials and reactions.

Thus, the subject material of the present description may provide chemical anchoring between the interconnect structure 110 and a dielectric material 130 rather than physical anchoring (e.g. roughening, as previously discussed) allowing fine interconnect spacing. Furthermore, cost reduction may be realized as the wet processes and material drying used in the roughening process are eliminated with the embodiments described herein. Moreover, the embodiments of the present description may be used to enhance dielectric layer 130 adhesion to the interconnect structure 110, when the interconnect structure 110 formed with an electroless copper deposition process, without desmearing the dielectric layer 130, as will be understood to those skilled in the art.

Figure 7:
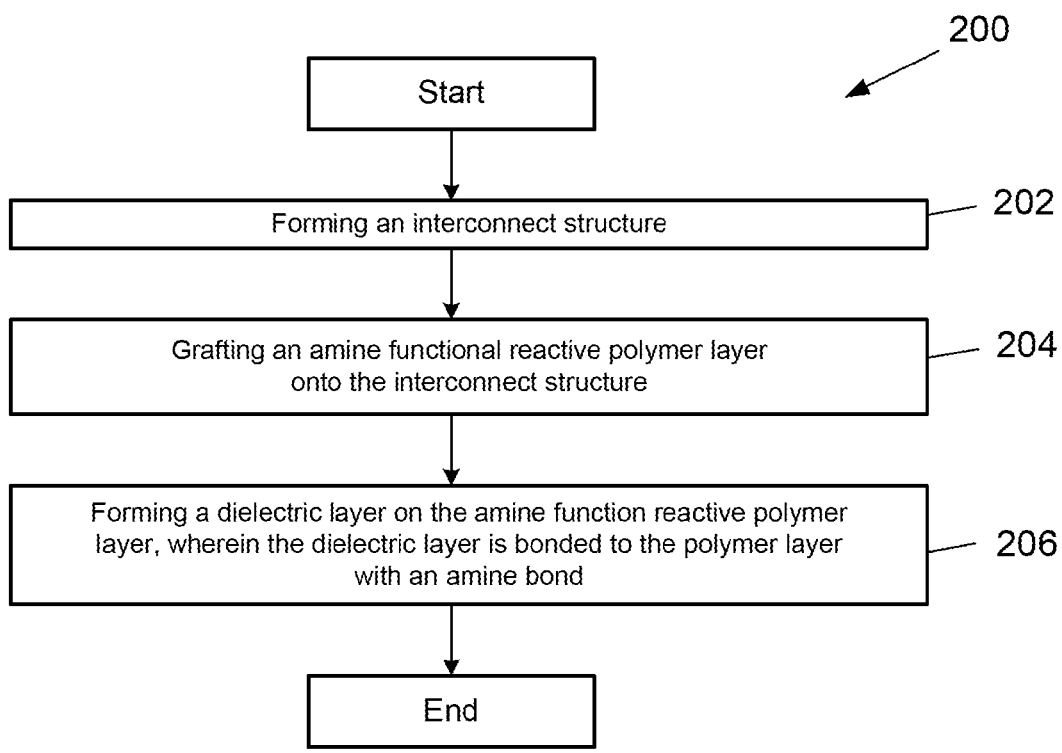
FIG. 7 is a flow chart of a process of fabricating a microelectronic structure, according to an embodiment of the present description.

FIG. 7 is a flow chart of a process 200 of fabricating a microelectronic structure according to an embodiment of the present description. As set forth in block 202, an interconnect structure may be formed. An amine functional reactive polymer layer may be grafted onto the interconnect structure, as set forth in block 204. As set forth in block 206, a dielectric layer may be bonded on the amine functional reactive polymer layer, wherein the dielectric layer is bonded to the polymer layer with an amine bond.

Figure 8:
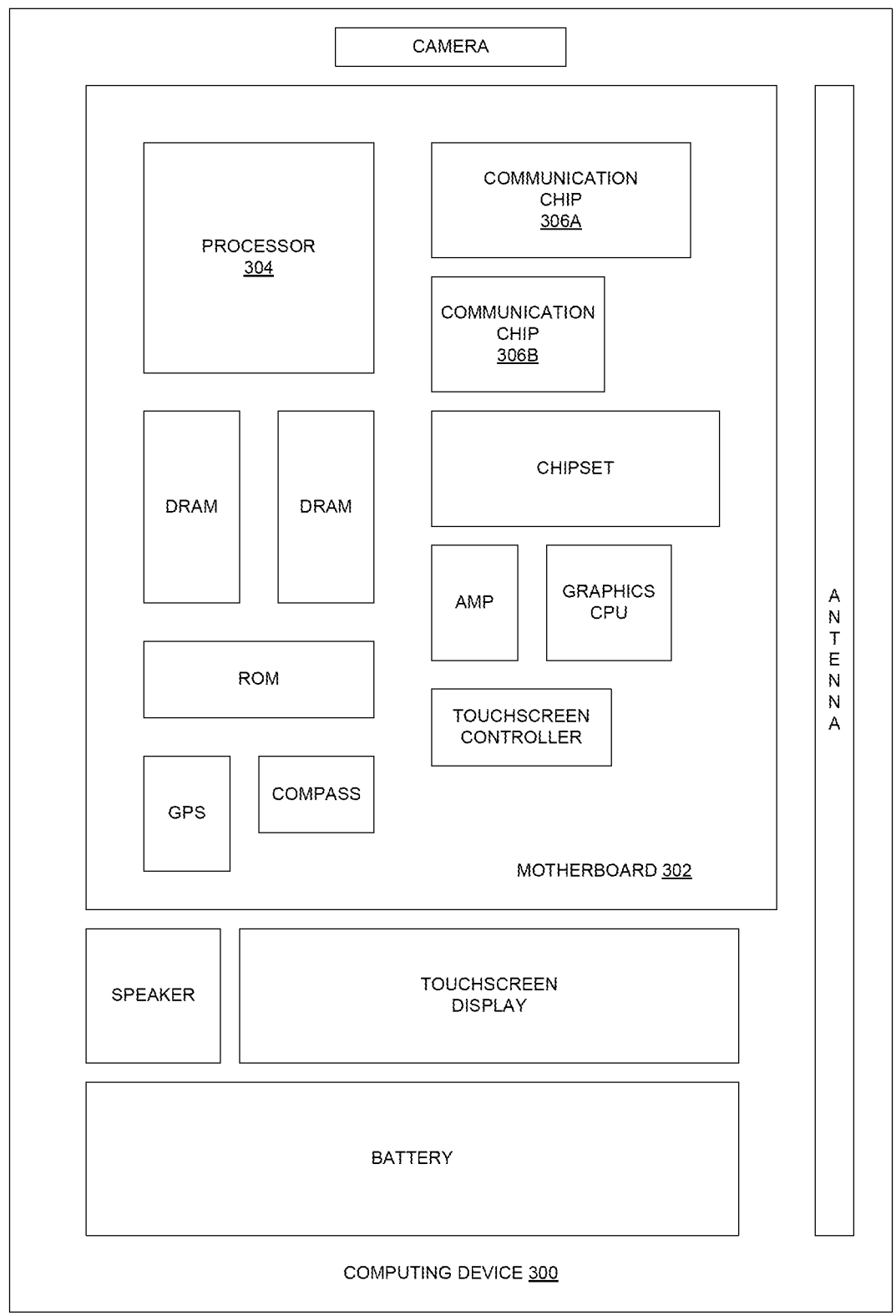
FIG. 8 illustrates a computing device in accordance with one implementation of the present description.

FIG. 8 illustrates a computing device 300 in accordance with one implementation of the present description. The computing device 300 houses a board 302. The board 302 may include a number of components, including but not limited to a processor 304 and at least one communication chip 306A, 306B. The processor 304 is physically and electrically coupled to the board 302. In some implementations the at least one communication chip 306A, 306B is also physically and electrically coupled to the board 302. In further implementations, the communication chip 306A, 306B is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306A, 306B enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor may be connected to other devices with one or more interconnection layers that are formed in accordance with implementations described above. The term "processor" may refer to any device or portion of a device that processes electronic data from registers and/or memory to transform that electronic data into other electronic data that may be stored in registers and/or memory.

The communication chip 306A, 306B also includes an integrated circuit die packaged within the communication chip 306A, 306B. In accordance with another implementation of the present description, the integrated circuit die of the communication chip may be connected to other devices with one or more interconnection layers that are formed in accordance with implementations described above.

In further implementations, another component housed within the computing device 300 may contain an integrated circuit die that includes an interconnect in accordance with embodiments of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-8. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a microelectronic structure may comprise an interconnect structure; an amine functional reactive polymer layer grafted onto the interconnect structure; and a dielectric layer on the amine functional reactive polymer layer, wherein the dielectric layer is bonded to the polymer layer with an amine bond.

In Example 2, the subject matter of Example 1 can optionally include the interconnect structure comprises a copper containing interconnect structure.

In Example 3, the subject matter of any of Examples 1 to 2 can optionally include the amine functional reactive polymer layer comprising a material selected from the group consisting of poly allylamine, poly 4-aminophenyl propargyl ether, poly amino methyl styrene, poly N-(3-aminopropyl)methacrylamide hydrochloride, polyethyleneimine, polypropyleneimine, poly 2-aminoethyl methacrylate hydrochloride, poly diallylamine, poly methacryloyl-L-lysine, poly N-(2-aminoethyl) methacrylamide hydrochloride, poly N-(3-aminopropyl)methacrylamide hydrochloride, and 2-N-morpholinoethyl acrylate.

In Example 4, the subject matter of any of Examples 1 to 3 can optionally include the dielectric layer comprising an oxygen functional reactive dielectric layer.

In Example 5, the subject matter of Example 4 can optionally include the oxygen functional reactive dielectric layer comprises an epoxy dielectric layer.

In Example 6, a method of forming a microelectronic structure may comprise forming an interconnect structure; grafting an amine functional reactive polymer layer onto the interconnect structure; and bonding a dielectric layer on the amine functional reactive polymer layer, wherein the dielectric layer is bonded to the polymer layer with an amine bond.

In Example 7, the subject matter of Example 6 can optionally include forming the interconnect structure comprising forming a copper containing interconnect structure.

In Example 8, the subject matter of any of Examples 6 to 7 can optionally include grafting the amine functional reactive polymer layer comprises grafting the amine functional reactive polymer layer from a material selected from the group consisting of poly allylamine, poly 4-aminophenyl propargyl ether, poly amino methyl styrene, poly N-(3-aminopropyl) methacrylamide hydrochloride, polyethyleneimine, polypropyleneimine, poly 2-aminoethyl methacrylate hydrochloride, poly diallylamine, poly methacryloyl-L-lysine, poly N-(2-aminoethyl) methacrylamide hydrochloride, poly N-(3-aminopropyl)methacrylamide hydrochloride, and 2-N-morpholinoethyl acrylate.

In Example 9, the subject matter of any of Examples 6 to 8 can optionally include grafting the amine functional reactive polymer layer comprising initiated chemical vapor deposition of the amine functional reactive polymer layer.

In Example 10, the subject matter of Example 9 can optionally include the initiated chemical vapor deposition comprising introducing a monomer and initiator into a chemical vapor deposition chamber.

In Example 11, the subject matter of Example 9 can optionally include at least one monomer being selected from the group consisting of allylamine, 4-aminophenyl propargyl ether, amino methyl styrene, N-(3-aminopropyl)methacrylamide hydrochloride, ethyleneimine, propyleneimine, 2-aminoethyl methacrylate hydrochloride, diallylamine, methacryloyl-L-Lysine, N-(2-aminoethyl) methacrylamide hydrochloride, N-(3-aminopropyl)methacrylamide hydrochloride, and 2-N-morpholinoethyl acrylate.

In Example 12, the subject matter of Example 9 can optionally include the initiator being selected from the group consisting of tert-butyl hydroperoxide, tert-butyl peracetate, cumene hydroperoxide, 2,5-di(tert-butylperoxy)-2,5-dimethyl-3-hexyne, dicumyl peroxide, 2,5-bis(tert-butylperoxy)-2,5-dimethylhexane, benzoyl peroxide 2-butanone peroxide, tert-butyl peroxide, lauroyl peroxide, tert-butyl peroxybenzoate, ammonium persulfate, hydroxymethanesulfinic acid monosodium salt dehydrate, potassium persulfate, sodium persulfate, 4,4'-azobis(4-cyanovaleric acid), 1,1'-azobis(cyclohexanecarbonitrile), azobisisobutyronitrile, 2,2'-azobis(2-methylpropionamidine) dihydrochloride, and 2,2'-azobis(2-methylpropionitrile).

In Example 13, the subject matter of any of Examples 6 to 8 can optionally include bonding the dielectric layer on the amine functional reactive polymer layer comprising bonding an oxygen functional reactive dielectric layer to the amine functional reactive polymer layer.

In Example 14, the subject matter of Example 13 can optionally include the oxygen functional reactive dielectric layer comprises an epoxy dielectric layer.

In Example 15, the subject matter of Example 14 can optionally include the epoxy dielectric layer reacts with the amine functional reactive polymer layer to form a secondary amine bond and a hydroxyl group.

In Example 16, a computing device may comprise a board; a microelectronic device attached to the board; and a microelectronic structure disposed within the microelectronic device, wherein the microelectronic structure comprises an interconnect structure; an amine functional reactive polymer layer grafted onto the interconnect structure; and a dielectric layer on the amine functional reactive polymer layer, wherein the dielectric layer is bonded to the polymer layer with an amine bond.

In Example 17, the subject matter of Example 16 can optionally include the interconnect structure comprises a copper containing interconnect structure.

In Example 18, the subject matter of any of Examples 16 to 17 can optionally include the amine functional reactive polymer layer comprising a material selected from the group consisting of poly allylamine, poly 4-aminophenyl propargyl ether, poly amino methyl styrene, poly N-(3-aminopropyl) methacrylamide hydrochloride, polyethyleneimine, polypropyleneimine, poly 2-aminoethyl methacrylate hydrochloride, poly diallylamine, poly methacryloyl-L-lysine, poly N-(2-aminoethyl) methacrylamide hydrochloride, poly N-(3-aminopropyl)methacrylamide hydrochloride, and 2-N-morpholinoethyl acrylate.

In Example 19, the subject matter of any of Examples 16 to 18 can optionally include the dielectric layer comprising an oxygen functional reactive dielectric layer.

In Example 20, the subject matter of Example 19 can optionally include the oxygen functional reactive dielectric layer comprises an epoxy dielectric layer.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
   an interconnect structure;
   an amine functional reactive polymer layer grafted onto the interconnect structure; and
   a dielectric layer on the amine functional reactive polymer layer, wherein the dielectric layer is bonded to the polymer layer with an amine bond.

2. The microelectronic structure of claim 1 wherein the interconnect structure comprises a copper containing interconnect structure.

3. The microelectronic structure of claim 1 wherein the amine functional reactive polymer layer comprises a material selected from the group consisting of poly allylamine, poly 4-aminophenyl propargyl ether, poly amino methyl styrene, poly N-(3-aminopropyl)methacrylamide hydrochloride, polyethyleneimine, polypropyleneimine, poly 2-aminoethyl methacrylate hydrochloride, poly diallylamine, poly methacryloyl-L-lysine, poly N-(2-aminoethyl) methacrylamide hydrochloride, poly N-(3-aminopropyl)methacrylamide hydrochloride, and 2-N-morpholinoethyl acrylate.

4. The microelectronic structure of claim 1 wherein the dielectric layer comprises an oxygen functional reactive dielectric layer.

5. The microelectronic structure of claim 4 wherein the oxygen functional reactive dielectric layer comprises an epoxy dielectric layer.

6. A method of fabricating a microelectronic structure, comprising:
   forming an interconnect structure;
   grafting an amine functional reactive polymer layer onto the interconnect structure; and
   bonding a dielectric layer on the amine functional reactive polymer layer, wherein the dielectric layer is bonded to the polymer layer with an amine bond.

7. The method of claim 6 wherein forming the interconnect structure comprises forming a copper containing interconnect structure.

8. The method of claim 6 wherein grafting the amine functional reactive polymer layer comprises grafting the amine functional reactive polymer layer from a material selected from the group consisting of poly allylamine, poly 4-aminophenyl propargyl ether, poly amino methyl styrene, poly N-(3-aminopropyl)methacrylamide hydrochloride, polyethyleneimine, polypropyleneimine, poly 2-aminoethyl methacrylate hydrochloride, poly diallylamine, poly methacryloyl-L-lysine, poly N-(2-aminoethyl) methacrylamide hydrochloride, poly N-(3-aminopropyl)methacrylamide hydrochloride, and 2-N-morpholinoethyl acrylate.

9. The method of claim 6 wherein grafting the amine functional reactive polymer layer comprises initiated chemical vapor deposition of the amine functional reactive polymer layer.

10. The method of claim 9 wherein the initiated chemical vapor deposition comprises introducing at least one monomer and at least one initiator into a chemical vapor deposition chamber.

11. The method of claim 10 wherein the at least one monomer is selected from the group consisting of allylamine, 4-aminophenyl propargyl ether, amino methyl styrene, N-(3-aminopropyl)methacrylamide hydrochloride, ethyleneimine, propyleneimine, 2-aminoethyl methacrylate hydrochloride, diallylamine, methacryloyl-L-Lysine, N-(2-aminoethyl) methacrylamide hydrochloride, N-(3-aminopropyl)methacrylamide hydrochloride, and 2-N-morpholinoethyl acrylate.

12. The method of claim 10 wherein the at least one initiator is selected from the group consisting of tert-butyl hydroperoxide, tert-butyl peracetate, cumene hydroperoxide, 2,5-di(tert-butylperoxy)-2,5-dimethyl-3-hexyne, dicumyl peroxide, 2,5-bis(tert-butylperoxy)-2,5-dimethylhexane, benzoyl peroxide 2-butanone peroxide, tert-butyl peroxide, lauroyl peroxide, tert-butyl peroxybenzoate, ammonium persulfate, hydroxymethanesulfinic acid monosodium salt dehydrate, potassium persulfate, sodium persulfate, 4,4'-azobis(4-cyanovaleric acid), 1,1'-azobis(cyclohexanecarbonitrile), azobisisobutyronitrile, 2,2'-azobis(2-methylpropionamidine) dihydrochloride, and 2,2'-azobis(2-methylpropionitrile).

13. The method of claim 6 wherein bonding the dielectric layer on the amine functional reactive polymer layer comprises bonding an oxygen functional reactive dielectric layer to the amine functional reactive polymer layer.

14. The method of claim 13 wherein the oxygen functional reactive dielectric layer comprises an epoxy dielectric layer.

15. The method of claim 14 wherein the epoxy dielectric layer reacts with the amine functional reactive polymer layer to form a secondary amine bond and a hydroxyl group.

16. A computing device, comprising:
a board;
a microelectronic device attached to the board; and
a microelectronic structure disposed within the microelectronic device, wherein the microelectronic structure comprises:
an interconnect structure;
an amine functional reactive polymer layer grafted onto the interconnect structure; and
a dielectric layer on the amine functional reactive polymer layer, wherein the dielectric layer is bonded to the polymer layer with an amine bond.

17. The computing device of claim 16 wherein the interconnect structure comprises a copper containing interconnect structure.

18. The computing device of claim 16 wherein the amine functional reactive polymer layer comprise a material selected from the group consisting of poly allylamine, poly 4-aminophenyl propargyl ether, poly amino methyl styrene, poly N-(3-aminopropyl)methacrylamide hydrochloride, polyethyleneimine, polypropyleneimine, poly 2-aminoethyl methacrylate hydrochloride, poly diallylamine, poly methacryloyl-L-lysine, poly N-(2-aminoethyl) methacrylamide hydrochloride, poly N-(3-aminopropyl)methacrylamide hydrochloride, and 2-N-morpholinoethyl acrylate.

19. The computing device of claim 16 wherein the dielectric layer comprises an oxygen functional reactive dielectric layer.

20. The computing device of claim 19 wherein the oxygen functional reactive dielectric layer comprises an epoxy dielectric layer.

* * * * *